United States Patent
Hashimoto et al.

(10) Patent No.: US 7,479,596 B2
(45) Date of Patent: Jan. 20, 2009

(54) SOLAR CELL AND METHOD FOR MANUFACTURING THE SAME

(75) Inventors: Yasuhiro Hashimoto, Souraku-gun (JP); Takayuki Negami, Hirakata (JP); Takuya Satoh, Yawata (JP)

(73) Assignee: Panasonic Corporation, Osaka (JP)

( * ) Notice: Subject to any disclaimer, the term of this patent is extended or adjusted under 35 U.S.C. 154(b) by 802 days.

(21) Appl. No.: 10/799,043

(22) Filed: Mar. 11, 2004

(65) Prior Publication Data

US 2004/0182434 A1 Sep. 23, 2004

(30) Foreign Application Priority Data

Mar. 18, 2003 (JP) ............... 2003-074445

(51) Int. Cl.
*H01L 31/072* (2006.01)
*H01L 31/00* (2006.01)

(52) U.S. Cl. .............. 136/256; 136/264; 136/265

(58) Field of Classification Search ........... 136/262, 136/264, 265, 256

See application file for complete search history.

(56) References Cited

U.S. PATENT DOCUMENTS 6,259,016 B1 7/2001 Negami et al.

FOREIGN PATENT DOCUMENTS

| CN | 1367536 | 9/2002 |
|---|---|---|
| JP | 6-45248 | 2/1994 |
| JP | 2000-323733 | 11/2000 |

OTHER PUBLICATIONS

H. Sheng et al, "Nonalloyed Al Ohmic Contacts to MgxZn1-xO", J. Electron. Mater. 31 (7), 811-814. (2002).*

* cited by examiner

*Primary Examiner*—Nam X Nguyen
*Assistant Examiner*—Jeffrey T. Barton
(74) *Attorney, Agent, or Firm*—Hamre, Schumann, Mueller & Larson, P.C.

(57) ABSTRACT

It is an object of the present invention to provide a solar cell, and a method for manufacturing the same, that includes a layer having Zn, Mg, and O, and with which an increase in efficiency can be achieved. The solar cell includes a first electrode layer, a second electrode layer, a p-type semiconductor layer disposed between the first electrode layer and the second electrode layer, and a layer A disposed between the second electrode layer and the p-type semiconductor layer, the layer A includes Zn, Mg, O, and at least one element M selected from Ca, Sr, Ba, Al, In, and Ga, and photoelectromotive force is generated due to light that is incident from the second electrode layer side.

7 Claims, 4 Drawing Sheets

SOLAR CELL AND METHOD FOR MANUFACTURING THE SAME

BACKGROUND OF THE INVENTION

1. Field of the Invention

The present invention relates to solar cells and methods for manufacturing the same.

2. Description of the Related Art

Thin film solar cells in which a compound semiconductor thin film made of Group Ib elements, Group IIIb elements, and Group VIb elements (chalcopyrite compound semiconductor thin film) is used as the light absorption layer have been reported. For example, $CuInSe_2$ (hereinafter, also referred to as "CIS") or $Cu(In,Ga)Se_2$ in which Ga is dissolved in CIS (hereinafter, also referred to as "CIGS") are examples of one type of compound semiconductor. Thin film solar cells employing CIS or CIGS as the light absorption layer (hereinafter, also referred to as "CIS solar cells") are known to have excellent properties, such as a high energy conversion efficiency and no deterioration of the conversion efficiency due to light emission, for example.

A ZnO layer was typically employed as a window layer in conventional high-efficiency CIS solar cells. In recent years, however, attention has turned to solar cells that employ a layer including Zn, Mg, and O ($Zn_{1-x}Mg_xO$ layer) instead of a ZnO layer, so that the conduction band offset between the light absorption layer and the window layer is closer to an optimal value. Research is also being conducted on CIS solar cells in which a $Zn_{1-x}Mg_xO$ layer is adopted so as to allow the buffer layer heretofore employed in conventional solar cells to be omitted. Such a solar cell is disclosed in U.S. Pat. No. 6,259,016 and JP 2000-323733A, for example.

However, when a $Zn_{1-x}Mg_xO$ layer is achieved simply by adding Mg to a ZnO layer, there were cases in which the volume resistivity of the $Z_{1-x}Mg_xO$ layer became larger than the ZnO layer, lowering the overall electrical conductivity of the solar cell. Currently there is a need for solar cells to be made more efficient, and likewise, there is also a need to further improve the efficiency of solar cells employing a $Zn_{1-x}Mg_xO$ layer.

In light of the foregoing situation, it is an object of the present invention to provide solar cells that include a layer comprising Zn, Mg, and O and that can be made more efficient than was the case conventionally, and methods for manufacturing such solar cells.

SUMMARY OF THE INVENTION

A solar cell includes a first electrode layer, a second electrode layer, a p-type semiconductor layer disposed between the first electrode layer and the second electrode layer, and a layer A disposed between the second electrode layer and the p-type semiconductor layer. Here, the layer A includes Zn (zinc), Mg (magnesium), O (oxygen), and at least one element M selected from Ca (calcium), Sr (strontium), Ba (barium), Al (aluminum), In (indium), and Ga (gallium). The solar cell of the present invention generates photoelectromotive force due to light that is incident from the second electrode layer side.

Next, a method of manufacturing a solar cell of the present invention is a method of manufacturing a solar cell that includes a first electrode layer, a second electrode layer, and a p-type semiconductor layer disposed between the first electrode layer and the second electrode layer, and that generates photoelectromotive force due to light that is incident from the second electrode layer side, the method including:

(i) a step of forming the first electrode layer and the p-type semiconductor layer on a substrate in that order;

(ii) a step of forming a layer A so that the p-type semiconductor layer is sandwiched between the layer A and the first electrode layer; and (iii) a step of forming the second electrode layer so that the layer A is sandwiched between the first electrode layer and the second electrode layer. Here, the layer A is a layer that includes Zn, Mg, O, and at least one element M selected from Ca, Sr, Ba, Al, In, and Ga.

DESCRIPTION OF THE PREFERRED EMBODIMENTS

Figure 1:
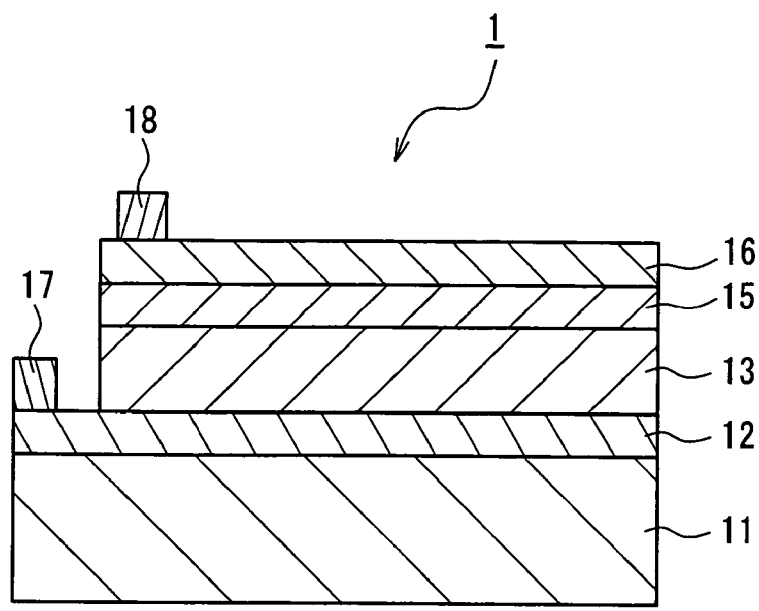
FIG. 1 is a cross-sectional diagram that schematically shows an example of the solar cell of the present invention.

Embodiments of the present invention are described below with reference to the diagrams. In the following description, identical components may be assigned identical reference numerals and a duplicate description thereof may be omitted.

First, a solar cell of the present invention is described.

FIG. 1 shows an example of a solar cell of the present invention. A solar cell 1 shown in FIG. 1 includes a first electrode layer 12, a second electrode layer 16, a p-type semiconductor layer 13 disposed between the first electrode layer 12 and the second electrode layer 16, and a layer A 15 disposed between the second electrode layer 16 and the p-type semiconductor layer 13. These layers are formed on a substrate 11. The layer A 15 includes Zn, Mg, O, and at least one element M selected from Ca, Sr, Ba, Al, In, and Ga. The p-type semiconductor layer 13 is the light absorption layer, and the solar cell 1 according to the present invention is a solar cell that generates a photoelectromotive force due to light that is incident from the second electrode layer 16 side. The photoelectromotive force that is generated can be transmitted to the outside via an electrode 17 that is electrically connected to the first electrode layer 12 and an electrode 18 that is electrically connected to the second electrode layer 16.

With such a solar cell, the volume resistivity of the layer A 15 can be made smaller than that of a conventional $Zn_{1-x}Mg_xO$ layer. This allows the overall electric conductivity of the solar cell to be increased, allowing high efficiency to be achieved, that is, allowing the energy conversion efficiency to be increased. It should by noted that x' in the conventional $Zn_{1-x'}Mg_{x'}O$ layer is for example a numerical value satisfying the expression $0.03 \leq x' \leq 0.3$.

With the solar cell 1 shown in FIG. 1, the first electrode layer 12, the p-type semiconductor layer 13, the layer A 15, and the second electrode layer 16 are disposed on the substrate 11, but in the solar cell of the present invention the substrate 11 is not absolutely necessary. It is only necessary that the second electrode layer 16, the layer A 15, the p-type semiconductor layer 13, and the first electrode layer 11 are included disposed in that order from the side on which light is incident, and where necessary, the substrate 11 can be omitted. The electrode 17 and the electrode 18, like the substrate 11, can be omitted as necessary. It should be noted that in the solar cell 1 of the present invention, layers can be freely disposed between the aforementioned layers where necessary.

The layer A 15 is described next.

The layer A 15 includes Zn, Mg, O, and at least one element M selected from Ca, Sr, Ba, Al, In, and Ga. There are no particular limitations as to the form in which the layer A 15 includes the above elements (the state of the above elements in the layer A 15). For example, the layer A 15 may include a compound that includes the elements M, Zn, Mg, and O, for example an oxide including the elements M, Zn, and Mg. More specifically, the layer A 15 can include an oxide expressed as (Zn,Mg,M)O, that is, an oxide in which the total atom number ratio of Zn, Mg, and the element(s) M is substantially equal to the atom number ratio of oxygen. Alternatively, the layer A 15 can include an oxide including Zn and Mg and that has been doped with the element(s) M. It should be noted that in the above-mentioned oxides it is not always necessary that the stoichiometric ratio between oxygen and the elements other than oxygen is established. For example, it can also be an oxide lacking some of the oxygen.

The layer A 15 functions as the window layer. As mentioned above, a ZnO layer was generally used as a window layer in conventional solar cells. The use of the layer A 15 instead of a ZnO layer in the solar cell of the present invention allows the conduction band offset between the layer A 15 and the p-type semiconductor layer 13, which is the light absorption layer, to be set to a more optimal value. It is thus possible to achieve a solar cell with higher release voltage properties. Here, if the p-type semiconductor layer 13 is made of the above-mentioned CIS ($CuInSe_2$) or CIGS ($Cu(In,Ga)Se_2$), then the conduction band offset can be set to an even more optimal value. The volume resistivity of the layer A 15 can be reduced compared to that of a $Zn_{1-x}Mg_xO$ layer in which the conduction band offset can be optimized like with the layer A 15. It is therefore possible to achieve a solar cell with which the energy conversion efficiency can be improved.

It is preferable that the element M included in the layer A 15 is at least one element selected from Ca, Sr, and Ba, and it is particularly preferable that it is Ca.

The layer A 15 is constituted primarily by the elements Zn, Mg, and O. The element M content of the layer A 15 is 20 atom percent or less, for example. It is preferable that the content is 3 atom percent or less, and it is particularly preferable that the content is 1 atom percent or less. The volume resistivity of the layer A 15 can be reduced even if the element M is present only in very trace amounts. For example, the volume resistivity of the layer A 15 can be reduced when the element M content of the layer A 15 is about 0.01 atom percent or more (preferably about 0.035 atom percent or more). It should be noted that there are no particular lower limits to the element M content, and for example, it may be about 0.005 atom percent. Also, if the element M content of the layer A 15 is too great, then the volume resistivity of the layer A 15 increases, and there is a risk that the energy conversion efficiency of the solar cell may instead decrease.

If the element M includes at least one element selected from Al, In, and Ga, then it is preferable that the content of the at least one element selected from Al, In, and Ga in the layer A 15 is not more than 3 atom percent.

The ratio between the number of atoms of Zn, Mg, and O in the layer A 15 is preferably expressed as Zn:Mg:O=(1-x):x:1.

The value of x in the above expression is within a range expressed by $0.05 \leq x \leq 0.35$, for example. In other words, it is preferable that the composition of the layer A 15 is obtained by adding the element M (for example, Ca) to an oxide material expressed by the composition formula $Zn_{1-x}Mg_xO$ ($0.05 \leq x \leq 0.35$).

Having the layer A 15 include the element M allows the volume resistivity of the layer A 15 to be reduced. The volume resistivity of the layer A 15 is specifically within a range of not more than $1 \times 10^{12} \Omega \cdot cm$, for example. Within this range, it is preferable that it is within a range of not more than $1 \times 10^{11} \Omega \cdot cm$. There are no particular restrictions on the lower limit of the volume resistivity of the layer A 15, and for example, it may be about $1 \times 10^8 \Omega \cdot cm$.

There are no particular limitations on the shape of the layer A 15, and it may be given any shape required by the solar cell 1. There are no particular limitations on the thickness of the layer A 15, and for example it may be in the range of 0.08 μm to 0.2 μm, and preferably it is in the range of 0.1 μm to 0.15 μm.

The other layers of the solar cell 1 of the present invention are discussed below.

There are no particular limitations regarding the material used for the first electrode layer 12, as long as the material is conductive. For example, it can be a metal or semiconductor whose volume resistivity is $6 \times 10^6 \Omega \cdot cm$ or less, for example. More specifically, it is possible to use Mo (molybdenum) as the material for the first electrode layer 12. There are no particular limitations on the shape of the first electrode layer 12, and it may be given any shape required by the solar cell 1. The same applies for the shape of the other layers as well. The thickness of the first electrode layer 12 is in the range of approximately 0.1 μm to 1 μm, for example.

The p-type semiconductor layer 13 is a light absorption layer. There are no particular limitations on the material used for the p-type semiconductor layer 13, as long as the material is a p-type semiconductor that functions as a light absorption layer. For example, it is possible to use a compound semiconductor in which Group Ib elements, Group IIIb elements, and Group VIb elements are the primary constitutional elements and which has a chalcopyrite structure (hereinafter, this may also be referred to as "Group I-III-VI compound semiconductor"). More specifically, it is possible to use a p-type compound semiconductor that has a chalcopyrite structure and that includes at least one element selected from Cu (copper), In, and Ga, and at least one element selected from Se (selenium) and S (sulfur). Even more specifically, a compound semiconductor such as $CuInSe_2$, $Cu(In,Ga)Se_2$, or either of these in which some of the Se has been substituted with S, can be used as the p-type semiconductor layer 13. The thickness of the p-type semiconductor layer 13 is in the range of approximately 0.4 μm to 3.5 μm, for example. It should be noted that the element group designations used in the present specification are based on IUPAC (1970) designations. In the IUPAC (1989) designations the Group Ib elements correspond to Group 11, Group IIIB elements correspond to Group 13, and Group VIb elements correspond to Group 16.

The second electrode layer 16, which is on the light incidence side, is for example made of a conductive material that has transmissivity. Here, "transmissivity" can be transmissivity with respect to light of a band that is incident on the solar cell 1. More specifically, it is possible to use indium-tin oxide (ITO), ZnO, or a layered film of these materials as the second electrode layer 16. The thickness of the second electrode layer 16 is in the range of approximately 0.1 μm to 0.3 μm, for example.

There are no particular limitations on the material used for the substrate 11, as long as it is a material that is generally used in solar cells. For example, it is possible to use a glass substrate, a stainless steel substrate, or a polyimide substrate, among others. It should be noted that if the solar cell of the present invention is to be integrated and the substrate is a conductive substrate (such as a stainless steel substrate), then it is necessary to form an insulating layer on the surface of the substrate or to perform a process to insulate the surface of the substrate.

There are no particular limitations on the material of the electrodes 17 and 18, as long as it is a material that is generally used in solar cells. For example, it is possible to use NiCr, Ag, Au, or Al. for example.

Figure 2:
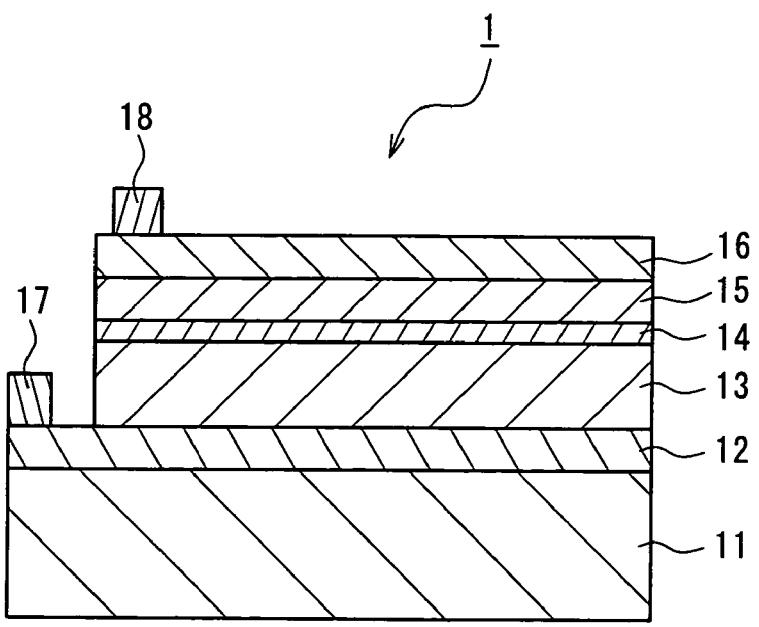
FIG. 2 is a cross-sectional diagram that schematically shows another example of the solar cell of the present invention.

FIG. 2 schematically shows another example of the solar cell of the present invention.

The solar cell 1 shown in FIG. 2 is the solar cell 1 shown in FIG. 1 in which an n-type semiconductor layer 14 further is provided between the p-type semiconductor layer 13 and the layer A 15. By modifying the solar cell in this way it is possible to achieve a solar cell having a p-n homojunction.

The material that is used for the n-type semiconductor layer 14 is for example a compound semiconductor including Zn, at least one element selected from Cu, In, and Ga, and at least one element selected from Se and S. More specifically, a semiconductor layer in which the same semiconductor layer as that of the p-type semiconductor layer 13 is further doped with Zn may be used as the n-type semiconductor layer 14.

The solar cell of the present invention can be fabricated using the following methods for manufacturing a solar cell of the present invention, for example.

FIG. 3A to FIG. 3D are process diagrams that schematically show the method for manufacturing a solar cell of the present invention.

Figure 3A:
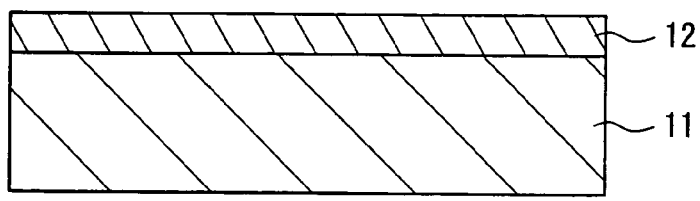
FIG. 3A to FIG. 3D are process step diagrams that schematically show an example of the method for manufacturing a solar cell of the present invention.
Figure 3B:
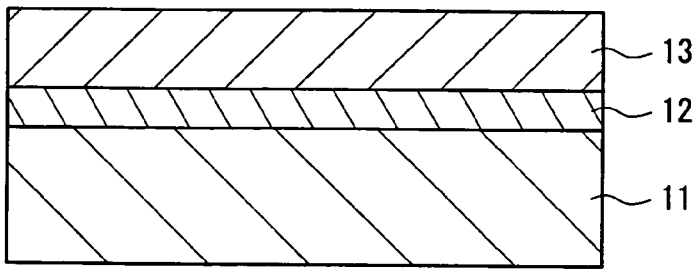

First, the first electrode layer 12 is formed on the substrate 11 as shown in FIG. 3A. Then, as shown in FIG. 3B, the p-type semiconductor layer 13 is formed on the first electrode layer 12 (step (i)). Methods that are generally used in the manufacture of solar cells can be used to form the first electrode layer 12 and the p-type semiconductor layer 13. The first electrode layer 12 can be formed through sputtering or vapor deposition, for example. The p-type semiconductor layer 13 can be formed using vapor deposition, and more specifically, it can be formed through a three-stage vapor deposition method, for example. The same applies even if the p-type semiconductor layer 13 is constituted by the above-mentioned Group I-III-VI compound semiconductor. A specific example of the above-mentioned Group I-III-VI compound semiconductor is a compound semiconductor that includes at least one element selected from Cu, In, and Ga, and at least one element selected from Se and S.

Figure 3C:
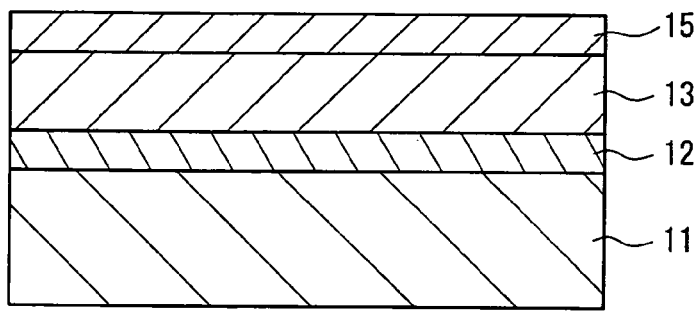

Next, as shown in FIG. 3C, the layer A 15 is formed so that the p-type semiconductor layer 13 is sandwiched between the layer A 15 and the first electrode layer 12 (step ii)). In the example shown in FIG. 3C, the layer A 15 is formed on the p-type semiconductor layer 13 (on a primary surface of the p-type semiconductor layer 13 on the side opposite its primary surface facing the first electrode layer 12).

There are no particular limitations regarding the method for forming the layer A 15 as long as a layer A 15 having the composition mentioned above can be formed. For example, the layer A 15 can be formed using sputtering. Sputtering allows the composition of the target to be changed so as to relatively easily restrict the composition of the layer A 15 that is formed. More specifically, it is possible to use a target that includes Zn, Mg, O, and at least one element M selected from Ca, Sr, Ba, Al, In, and Ga. It is also possible to use a plurality of targets having different compositions. Alternatively, it is also possible to form the layer A 15 in a weakly oxidizing atmosphere using a target including the element M, Zn, and Mg. In this case as well, it is also possible to use a plurality of different targets having different compositions.

Figure 3D:
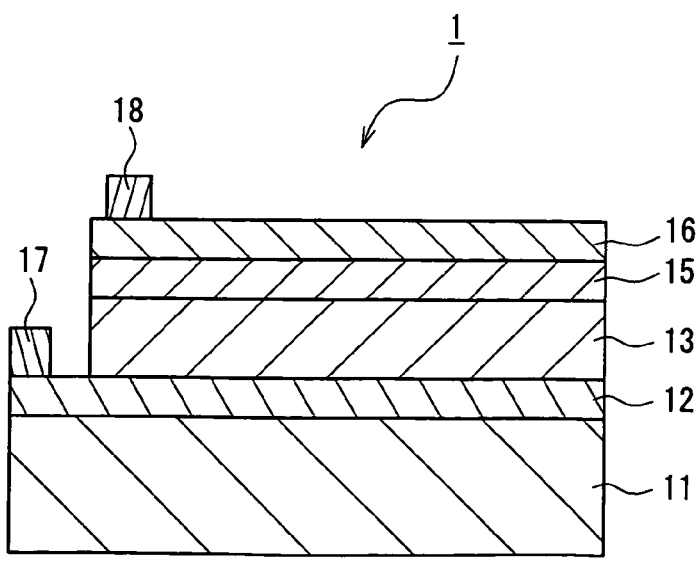

Next, as shown in FIG. 3D, the second electrode layer 16 is formed so that the layer A 15 is sandwiched between the first electrode layer 12 and the second electrode layer 16 (step (iii)). In the example shown in FIG. 3D, the second electrode layer 16 is formed on the layer A 15. A method that is generally used in the manufacture of solar cells, such as sputtering, can be used to form the second electrode layer 16.

Thus, the solar cell 1 of the present invention can be formed. It should be noted that, as shown in FIG. 3D, it is also possible to provide the electrodes 17 and 18 if necessary. There are no particular limitations on the method for forming the electrodes 17 and 18, and as long as the electrodes can be connected electrically to the electrode layers, any general method may be used. It is also possible to freely dispose any layers between the various layers making up the solar cell if necessary.

The composition, configuration, and thickness, for example, of the layers that are formed through the manufacturing method of the present invention can be the same as those of the layers in the above-mentioned solar cell of the present invention.

Figure 4A:
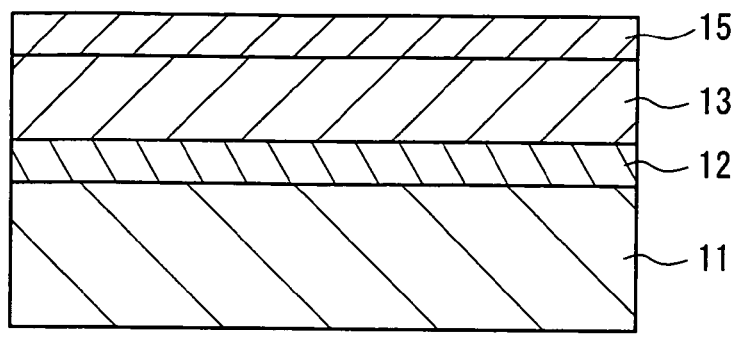
FIG. 4A to FIG. 4C are process step diagrams that schematically show another example of the method for manufacturing a solar cell of the present invention.
Figure 4B:
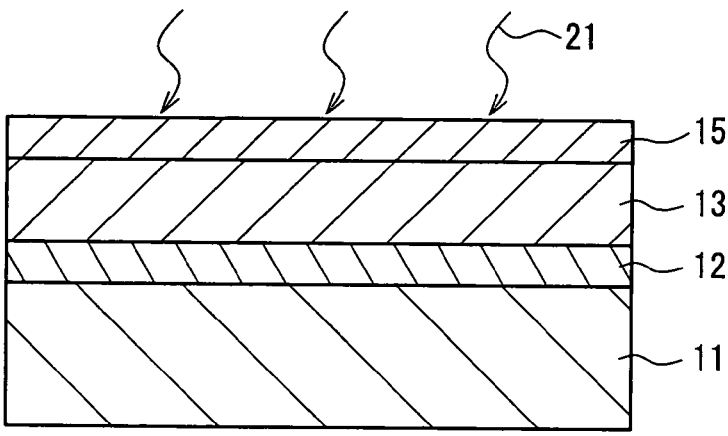
Figure 4C:
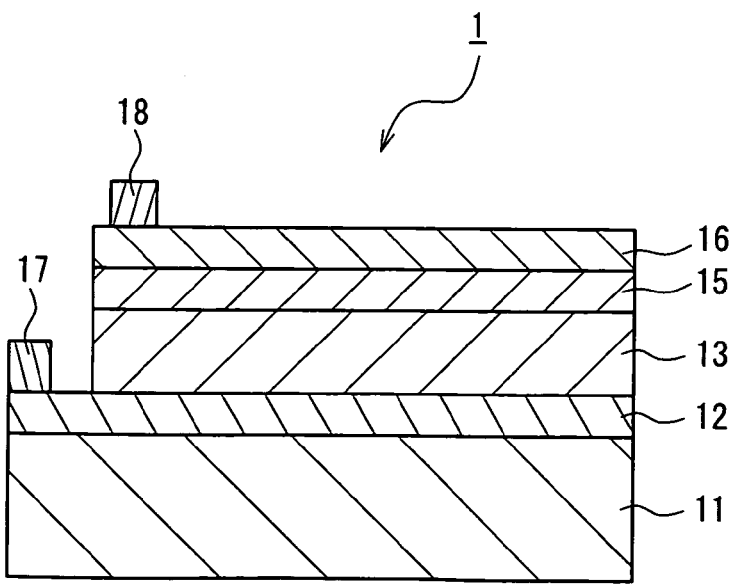

Another example of the method for manufacturing a solar cell according to the present invention is shown in FIG. 4A to FIG. 4C.

First, as shown in FIG. 4A, the first electrode 12, the p-type semiconductor layer 13, and the layer A 15 are formed in that order on the substrate 11. The methods for forming these layers may be the same as those of the example shown in FIG. 3A to FIG. 3C.

Next, as shown in FIG. 4B, heat 21 is applied to the layer A 15 to thermally process the layer A 15. That is, the manufacturing method of the present invention can include a step for thermally processing the layer A 15 that has been formed after the above step (ii). Thermally processing the layer A 15 allows the volume resistivity of the layer A 15 to be further reduced.

Next, as shown in FIG. 4C, the second electrode layer 16 is formed so that the layer A 15 is sandwiched between the first electrode layer 12 and the second electrode layer 16, and if necessary, the electrodes 17 and 18 are formed, thereby forming the solar cell 1 of the present invention.

From the standpoint of maintaining the composition of the layer A 15 that is formed, it is preferable that thermal processing of the layer A 15 is carried out in an inert gas atmosphere. More specifically, it can be carried out in an atmosphere that includes nitrogen gas, a rare gas, or a combination of these gases. Argon gas, for example, can be used as the rare gas. The temperature at which thermal processing is performed can be freely set according to physical properties of the layer A 15 that are required, and for example can be within the range of 100° C. to 300° C., and preferably is within the range of 150° C. to 250° C. The thermal processing time changes depending on the thermal processing temperature, but for example can be about 5 to 15 minutes.

There are no particular limitations on the method of applying heat to the layer A 15, and for example, heat can be applied by heating the substrate 11. Further, there are no particular restrictions regarding the period during which the thermal processing is carried out, and for example, it is possible to execute the thermal processing after the layer A 15 has been formed but before the second electrode layer 16 is formed, and it is also possible to execute thermal processing after the second layer 16 has been formed or after the entire solar cell has been formed.

Another example of a method for manufacturing a solar cell according to the present invention is shown in FIG. 5A to FIG. 5D.

Figure 5A:
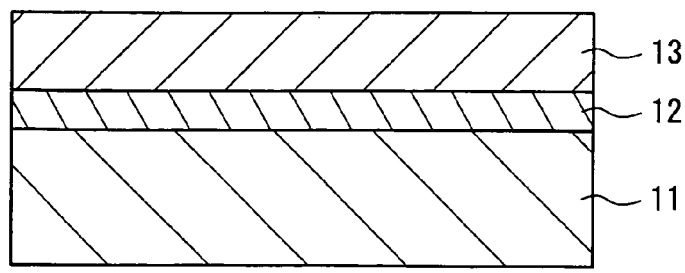
FIG. 5A to FIG. 5D are process step diagrams that schematically show yet another example of the method for manufacturing a solar cell of the present invention.

First, as shown in FIG. 5A, the first electrode layer 12 and the p-type semiconductor layer 13 are formed on the substrate 11 in that order. The method of forming these layers can be same as in the example shown in FIG. 3A and FIG. 3B.

Figure 5B:
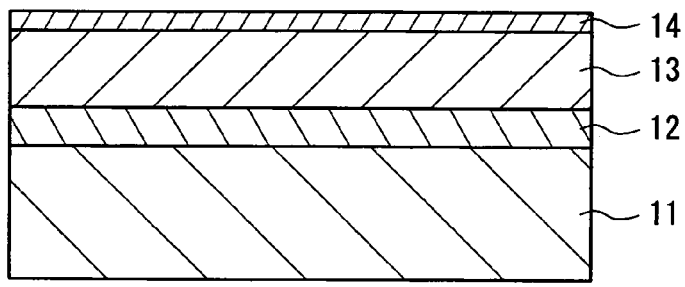

Next, as shown in FIG. 5B, the n-type semiconductor layer 14 is formed on the p-type semiconductor layer 13. That is, the manufacturing method of the present invention can further include, between the step (i) and the step (ii), a step (a) of forming an n-type semiconductor layer on the p-type semiconductor layer. It is therefore possible to form the solar cell 1 shown in FIG. 2.

A method that is generally used in the manufacture of solar cells, such as vapor deposition, can be used to form the n-type semiconductor layer 14. Also, if the composition of the n-type semiconductor layer 14 to be formed is like the composition of the p-type semiconductor layer 13, then the n-type semiconductor layer 14 also can be formed by doping a portion of the p-type semiconductor layer 13 with another element, such as Zn. Likewise, it is also possible to form an additional p-type semiconductor layer on the p-type semiconductor layer 13 and then dope the p-type semiconductor layer that is formed with another element, such as Zn, to form the n-type semiconductor layer 14. The doping element can be chosen freely to correspond to the composition of the n-type semiconductor layer 14 that is necessary.

Figure 5C:
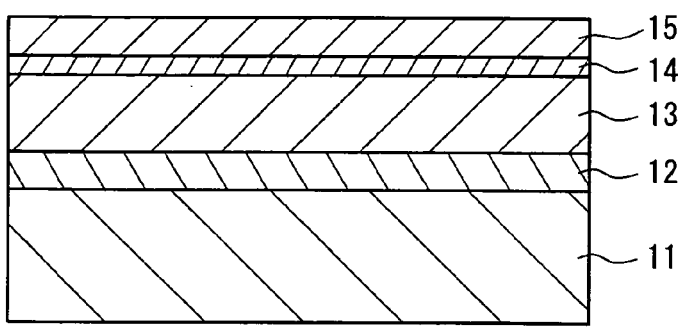
Figure 5D:
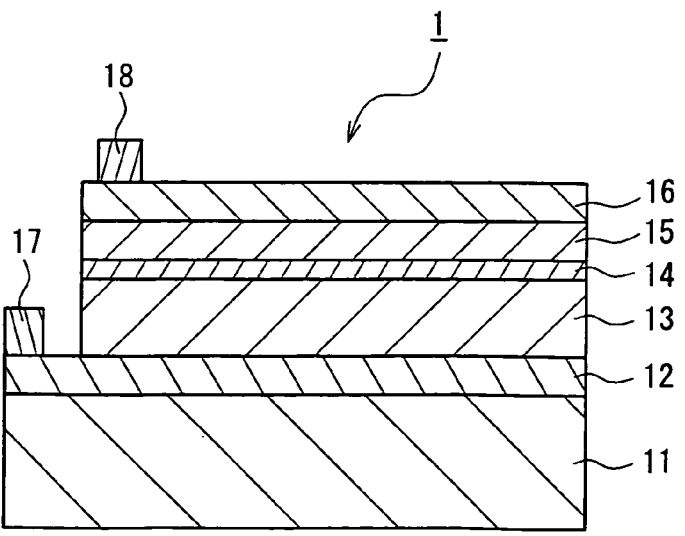

Next, as shown in FIG. 5C and FIG. 5D, the layer A 15 and the second electrode layer 16, for example, are formed so as to form a solar cell of the present invention that includes the n-type semiconductor layer 14, such as the one shown in FIG. 2.

WORKING EXAMPLES

The present invention is described in further detail below using working examples. The present invention is not limited to the following working examples, however.

Working Example 1

In Working Example 1, the layer A used in the solar cell of the present invention was fabricated and its properties were assessed.

First, a $Zn_{0.9}Mg_{0.1}O$ film (thickness: 100 nm) was formed on a silicon wafer substrate through two-dimensional sputtering in which a ZnO target and a MgO target were used. Sputtering was carried out in an argon gas atmosphere (gas pressure: 2.7 Pa ($2\times10^{-2}$ Torr)) by applying a 200 W power high frequency to the ZnO target and applying a 100 W power high frequency to the MgO target.

Using the same method, a $Zn_{0.9}Mg_{0.1}Ca_{0.0007}O$ film (thickness: 100 nm) was formed as the layer A on a silicon wafer substrate through two-dimensional sputtering using a ZnO target and a MgO target including 1 atom percent Ca. At this time, the argon gas pressure was 2.7 Pa($2\times10^{-2}$ Torr), the high frequency power imparted to the ZnO target was 200 W, and the high frequency power imparted to the MgO target was 100 W.

The volume resistivity of the films fabricated in this manner was measured. The volume resistivity was measured using voltage source current measurement (VSIM). Measurement was carried out using a DC voltage-current source and a monitor, and in an atmosphere of with an applied current range of 0.2 mV to 40 mV, a measurement temperature of 21° C., and a relative humidity of 65±5%. Mercury was used for the surface electrode and the substrate was used for the counter electrode. The number of samples of each film was n=3, and the average value of these was found.

The volume resistivity of the $Zn_{0.9}Mg_{0.1}O$ film that does not include Ca was approximately $7.3\times10^{12}\Omega\cdot cm$ to $8\times10^{12}\Omega\cdot cm$, whereas the volume resistivity of the layer A that does include Ca ($Zn_{0.9}Mg_{0.1}Ca_{0.0007}O$ film) was $1\times10^{12}\Omega\cdot cm$. The result of this measurement of the volume resistivity showed that there was fluctuation among the samples of the films. In the $Zn_{0.9}Mg_{0.1}O$ film that does not include Ca, the average volume resistivity in most of the samples was approximately $8\times10^{12}\Omega\cdot cm$. However, in about one-tenth of the samples there appeared a film whose volume resistivity was about $1\times10^{12}\Omega\cdot cm$, so that the overall average was found to be about $7.3\times10^{12}\Omega\cdot cm$. In contrast, in the layer A that includes Ca ($Zn_{0.9}Mg_{0.1}Ca_{0.0007}O$ film), the volume resistivity of all of the samples that were produced was about $1\times10^{12}\Omega\cdot cm$ or a value below this. Thus, it was clear that by adopting the layer A, which includes Ca, the resistivity could be reduced compared to that of the ZnMgO film.

Next, after each film was thermally processed, the volume resistivity was measured again. Thermal processing was carried out for ten minutes at 200° C. in a nitrogen atmosphere.

The result was that the volume resistivity of the $Zn_{0.9}Mg_{0.1}O$ film after thermal processing was $8.7\times10^{12}\Omega\cdot cm$, exhibiting a slight increase. In contrast, the volume resistivity of the layer A that includes Ca was $1\times10^{11}\Omega\cdot cm$. That is, in the layer A that includes Ca it was possible to further reduce the volume resistivity through thermal processing.

In the present working example a case was shown in which the layer A included Ca, but the same results were obtained when it included Sr, Ba, Al, In, or Ga, for example.

Working Example 2

In Working Example 2, the solar cell shown in FIG. 2 was fabricated and its properties were assessed.

First, a Mo film was formed on a glass substrate to serve as the first electrode layer 12. Sputtering was used to form the Mo film. Next, using vapor deposition, a $Cu(In,Ga)Se_2$ film (thickness: 2 μm) serving as the p-type semiconductor layer 13 was formed on the Mo film. The temperature of the glass substrate was then raised to 300° C. and for three minutes Zn was vapor deposited on the $Cu(In,Ga)Se_2$ film. The vapor deposition of Zn resulted in Zn being added to a portion of the $Cu(In,Ga)Se_2$ film about 50 nm deep from the surface. The portion to which Zn was added corresponds to the n-type semiconductor layer 14.

Next, in the same manner as in Working Example 1, a $Zn_{0.9}Mg_{0.1}Ca_{0.0007}O$ film (thickness: 100 nm) serving as the layer A 15 was formed on the n-type semiconductor layer 14.

Then, using sputtering, an ITO film (thickness: 100 nm), which is a transparent conductive film, was formed on the layer A 15 as the second electrode layer 16. The ITO film was formed in an argon gas atmosphere (gas pressure 1.07 Pa($8\times10^{-3}$ Torr)) by applying a 400 W power high frequency to a target. Lastly, a NiCr film and an Ag film were deposited on the Mo film and the ITO film using electron beam vapor deposition to form the electrodes 17 and 18, thereby fabricating a solar cell (sample 1) such as that shown in FIG. 2.

In addition to the above solar cell, a solar cell in which a $Zn_{0.9}Mg_{0.1}O$ film (thickness: 100 nm) was provided in place of the layer A 15 was fabricated as a comparative example. The $Zn_{0.9}Mg_{0.1}O$ film was formed in the same manner as in Working Example 1.

A pseudo-solar light beam of 1.5 AM (Air Mass) and 100 mW/cm$^2$ was irradiated onto the two types of solar cells thus fabricated, and their electricity generating properties were assessed.

With the solar cell including a $Zn_{0.9}Mg_{0.1}O$ film, that is, the comparative example, the short-circuit current was 0.91 mA/cm$^2$, the release voltage was 0.125 V, the fill factor (FF) was 0.241, and the conversion efficiency was 0.027%. The current-voltage curve of the comparative example indicates the diode properties, and since the photoelectric current is substantially 0, the resulting conversion efficiency was substantially 0%. The solar cell of the comparative example was subjected to the same thermal processing as in Working Example 1 (nitrogen atmosphere, 200° C., 10 minutes), and the resulting short-circuit current was 19.4 mA/cm$^2$, the release voltage was 0.50 V, the fill factor was 0.181, and the conversion efficiency was 1.8%.

In contrast, with the sample 1, which includes the $Zn_{0.9}Mg_{0.1}Ca_{0.0007}O$ film, that is, the layer A, the short-circuit current was 30.4 mA/cm$^2$, the release voltage was 0.467 V, the fill factor was 0.576, and the conversion efficiency was 8.2%. Thus, it was confirmed that by disposing the layer A, which includes Ca, the result was an improvement in the electricity generating properties of the solar cell.

Moreover, when the sample 1 was subjected to the same thermal processing as in Working Example 1 (nitrogen atmosphere, 200° C., 10 minutes), the resulting short-circuit current was 35.1 mA/cm$^2$, the release voltage was 0.594 V, the fill factor was 0.668, and the conversion efficiency was 13.9%, exhibiting a further improvement in electricity generating properties. It was thus clear that the energy conversion efficiency of the solar cell could be further improved by thermal processing.

In the present working example a case was shown in which the layer A included Ca, but the same results can be achieved when it includes Sr, Ba, Al, In, or Ga, for example.

Working Example 3

A solar cell such as that shown in FIG. 2 was fabricated in the same manner as in Working Example 2. As regards fabrication of the solar cell, thermal processing was performed in the same way as in Working Example 2. However, seven different samples (samples 2 to 8) with varying Ca content in the layer A 15 were prepared. The Ca content in the layer A 15 of each of the samples, in order from sample 2, was set to 0 atom percent, 0.01 atom percent, 0.1 atom percent, 1 atom percent, 5 atom percent, 10 atom percent, and 20 atom percent. That is, if the layer A 15 is expressed in terms of a $Zn_{0.9}Mg_{0.1}Ca_yO$ film, then the value of y, in order from sample 2, is 0, 0.0001, 0.001, 0.01, 0.05, 0.1, and 0.2. It should be noted that the Ca content of the layer A was changed by adjusting the proportion of Ca included in the MgO target. Also, the Ca content was found by ICP (inductively coupled plasma) emission spectrometry.

The electricity generating properties of the seven samples fabricated in this manner were assessed in the same way as in Working Example 2. The results are tabulated in Table 1.

TABLE 1

| Ca Content (atom %) | Short-Circuit Current (mA/cm$^2$) | Release Voltage (V) | Fill Factor | Conversion Efficiency (%) |
|---|---|---|---|---|
| 0 | 20.3 | 0.47 | 0.189 | 1.8 |
| 0.01 | 30.1 | 0.55 | 0.553 | 9.2 |
| 0.1 | 35.1 | 0.61 | 0.676 | 14.6 |
| 1 | 34.6 | 0.60 | 0.656 | 13.7 |
| 5 | 28.4 | 0.47 | 0.334 | 4.5 |
| 10 | 23.4 | 0.48 | 0.231 | 2.6 |
| 20 | 22.6 | 0.49 | 0.199 | 2.2 |

As shown in Table 1, it is clear that having the layer A include about 0.01 atom percent Ca allows the energy conversion efficiency to be improved compared to that of the comparative example shown in Working Example 2. This result can be achieved even if the layer A includes about 20 atom percent Ca, and the greatest increase in energy conversion efficiency resulted when the Ca content was 5 atom percent or less, and particularly when it was 1 atom percent or less.

As discussed above, with the present invention it is possible to provide a solar cell, and a method for manufacturing the same, that includes a layer including Zn, Mg, and O and with which greater efficiency than in conventional solar cells can be achieved. In particular, with the preset invention it is possible to provide a CIS or CIGS solar cell with which greater efficiency can be achieved.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A solar cell comprising a first electrode layer, a second electrode layer, a p-type semiconductor layer disposed between the first electrode layer and the second electrode layer, and a layer A disposed between the second electrode layer and the p-type semiconductor layer, wherein the layer A comprises Zn, Mg, O, and at least one element M selected from Ca, Sr, Ba, Al, In, and Ga;

wherein a content of the element M in the layer A is in the range of 0.01 to 3 atom percent;

wherein a ratio of atom numbers between Zn, Mg, and O comprised in the layer A satisfies an expression Zn:Mg:O=(1−x):x:1, where x is a numerical value that satisfies an expression $0.05 \leq x \leq 0.35$; and wherein a photoelectromotive force is generated due to light that is incident from the second electrode layer side.

2. The solar coil according to claim 1, wherein the element M is at least one element selected from Ca, Sr, and Ba.

3. The solar cell according to claim 1, wherein the element M is at least one element selected from Al, In, and Ga.

4. The solar cell according to claim 1, wherein a volume resistivity of the layer A is not more than $1 \times 10^{12}$ Ω·cm.

5. The solar cell according to claim 1,
wherein the p-type semiconductor layer is a compound semiconductor that comprises at least one element selected from Cu, In, and Ga, and at least one element selected from Se and S.

6. The solar cell according to claim 1, further comprising:
an n-type semiconductor layer disposed between the p-type semiconductor layer and the layer A;
wherein the n-type semiconductor layer is a compound semiconductor that comprises Zn, at least one element selected from Cu, In, and Ga, and at least one element selected from Se and S.

7. The solar cell according to claim 1,
wherein the first electrode layer is made of Mo, and the second electrode layer is a transparent electrode.

* * * * *